(12) United States Patent
Yamada et al.

(10) Patent No.: US 7,288,716 B2
(45) Date of Patent: Oct. 30, 2007

(54) TRANSPARENT CONDUCTOR

(75) Inventors: Chieko Yamada, Tokyo (JP); Shigeo Kurose, Tokyo (JP); Koichi Hikida, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/427,432

(22) Filed: Jun. 29, 2006

(65) Prior Publication Data

US 2007/0000678 A1   Jan. 4, 2007

(30) Foreign Application Priority Data

Jun. 30, 2005   (JP) .............................. 2005-191886

(51) Int. Cl.
*H01B 7/34* (2006.01)

(52) U.S. Cl. ................. 174/36; 174/110 R; 174/117 F; 174/117 FF

(58) Field of Classification Search ............ 174/110 R, 174/113 R, 117 R, 117 F, 117 FF
See application file for complete search history.

(56) References Cited

U.S. PATENT DOCUMENTS

| | | | |
|---|---|---|---|
| 2003/0140963 A1* | 7/2003 | Yamanaka et al. | 136/263 |
| 2004/0032546 A1* | 2/2004 | Ito | 349/96 |
| 2006/0050359 A1* | 3/2006 | Takeyama | 359/270 |

FOREIGN PATENT DOCUMENTS

JP         11-250764 A   *   9/1999

* cited by examiner

*Primary Examiner*—William H. Mayo, III
(74) *Attorney, Agent, or Firm*—Greenblum & Bernstein, P.L.C.

(57) ABSTRACT

A transparent conductor includes a film-shaped or plate-shaped support and a transparent conductive layer that is disposed on the support and has a surface formed as a rough surface. The surface of the transparent conductive layer is formed so that a maximum peak height that shows a surface roughness of the surface is in a range of 0.35 μm to 0.43 μm, inclusive.

6 Claims, 4 Drawing Sheets

CHARACTERISTICS MEASUREMENT RESULTS

|  | 1A (4A,30A) | 1B (4B,30B) | 1C (4C,30C) | 1D (4D,30D) |
|---|---|---|---|---|
| $S_a$ (μm) | 0.10 | 0.12 | 0.16 | 0.11 |
| $S_p$ (μm) | 0.35 | 0.43 | 0.41 | 1.66 |
| $S_v$ (μm) | 2.37 | 2.06 | 1.03 | 0.22 |
| $S_t$ (μm) | 2.72 | 2.49 | 1.44 | 1.88 |
| OCCURRENCE OF NEWTON'S RINGS | NONE | NONE | NONE | NONE |
| CHANGE IN RESISTANCE (%) | 1.5 | 2.3 | 2.5 | 12 |

TRANSPARENT CONDUCTOR

BACKGROUND OF THE INVENTION

1. Field of the Invention

The present invention relates to a transparent conductor where a transparent conductive layer is disposed on a film-shaped or plate-shaped support.

2. Description of the Related Art

As one example of this type of transparent conductor, a transparent electrode (the outer transparent electrode that is touched) used in a touch panel disclosed by Japanese Laid-Open Patent Publication No. H11-250764 is known. This transparent electrode is constructed of a transparent resin film and a transparent thin-film electrode layer that is laminated on the transparent resin film. To prevent Newton's rings (interference fringes) from being produced when the transparent electrode is touched with a finger or a pen, the surface of the transparent thin-film electrode layer is formed with a surface roughness within a predetermined range. The "center line average roughness" and "maximum height" that show the surface roughness of the transparent electrode are respectively set in a range of 0.05 μm to 2 μm, inclusive, and in a range of 0.6 μm to 2.5 μm, inclusive.

SUMMARY OF THE INVENTION

By investigating the transparent electrode described above, the present inventors found the following problem. That is, with the above transparent electrode, by forming the surface of the transparent thin-film electrode layer so that the center line average roughness and maximum height thereof are in the respective ranges described above, it is possible to avoid the production of Newton's rings. However, even when the center line average roughness and maximum height are within the set ranges, for example, if the parts that protrude from the center line (average line) (hereinafter such parts are referred to as "peaks") are high, when the transparent thin-film electrode layer is incorporated in a touch panel and touch operations are repeatedly performed, the surface of the transparent thin-film electrode layer of an inner transparent electrode disposed on the display side opposite the outer transparent electrode can be damaged by the peaks. In this type of touch panel, when the surface of a transparent thin-film electrode layer is damaged, the resistance of the transparent thin-film electrode layer changes, resulting in a problem that it can be difficult to specify a touched position.

The present invention was conceived in view of the problem described above, and it is a principal object of the present invention to provide a transparent conductor that can prevent Newton's rings from being produced and can reduce the incidence of damage.

To achieve the stated object, a transparent conductor according to the present invention includes: a film-shaped or plate-shaped support; and a transparent conductive layer that is disposed on the support and has a surface formed as a rough surface, wherein the surface of the transparent conductive layer is formed so that a maximum peak height that shows a surface roughness of the surface is in a range of 0.35 μm to 0.43 μm, inclusive.

According to the above transparent conductor, the transparent conductive layer is formed so that a maximum peak height that shows a surface roughness of the surface is in a range of 0.35 μm to 0.43 μm, inclusive. With this construction, light is appropriately scattered, and therefore the production of Newton's rings can be reliably avoided. Also, unlike a conventional transparent conductor where the maximum peak height is large, by setting the maximum peak height in a range of 0.35 μm to 0.43 μm, inclusive, the heights of the peaks can be averaged, so that when an upper electrode and a lower electrode slide against each other, the pressure is distributed among the peaks and it is therefore possible to reliably reduce damage to the surfaces. Accordingly, with a touch panel in which the transparent conductor described above is incorporated, it is possible to reliably prevent the production of Newton's rings and to sufficiently improve durability.

Another transparent conductor according to the present invention includes: a film-shaped or plate-shaped support; and a transparent conductive layer that is disposed on the support and has a surface formed as a rough surface, wherein the surface of the transparent conductive layer is formed so that a maximum valley depth that shows a surface roughness of the surface is in a range of 1.03 μm to 2.37 μm, inclusive.

According to the above transparent conductor, the transparent conductive layer is formed so that a maximum valley depth that shows a surface roughness of the surface is in a range of 1.03 μm to 2.37 μm, inclusive. With this construction, light is appropriately scattered, and therefore the production of Newton's rings can be reliably avoided. Also, unlike a conventional transparent conductor where the maximum valley depth is small, by setting the maximum valley depth in a range of 1.03 μm to 2.37 μm, inclusive, it is possible to reduce the number of peaks proportionate to the increase in the number of valleys, so that when an upper electrode and a lower electrode slide against each other, it is possible to reliably reduce damage to the surfaces. Accordingly, with a touch panel in which the transparent conductor described above is incorporated, it is possible to reliably prevent the production of Newton's rings and to sufficiently improve durability.

Yet another transparent conductor according to the present invention includes: a film-shaped or plate-shaped support; and a transparent conductive layer that is disposed on the support and has a surface formed as a rough surface, wherein the surface of the transparent conductive layer is formed so that a maximum peak height that shows a surface roughness of the surface is in a range of 0.35 μm to 0.43 μm, inclusive and a maximum valley depth that shows the surface roughness of the surface is in a range of 1.03 μm to 2.37 μm, inclusive.

According to the above transparent conductor, the transparent conductive layer is formed so that a maximum peak height that shows a surface roughness of the surface is in a range of 0.35 μm to 0.43 μm, inclusive and a maximum valley depth that shows the surface roughness of the surface is in a range of 1.03 μm to 2.37 μm, inclusive. With the above construction, it is possible to average the heights of the peaks and to reduce the number of peaks proportionate to the increase in the number of valleys, and therefore the pressure can be distributed among the peaks when an upper electrode and a lower electrode slide against each other and the frequency of contact between the peaks and the surface of the lower electrode can be reduced. As a result, it is possible to reduce damage to the surfaces more reliably. Accordingly, with a touch panel in which the transparent conductor described above is incorporated, it is possible to reliably reduce the production of Newton's rings and to significantly improve durability.

Here, the transparent conductive layer may be constructed by compressing conductive fine particles. With this construction, it is possible to increase the points of contact between the conductive fine particles and to increase the contact area, thereby increasing the strength of the transparent conductive layer and improving the light transmittance of the transparent conductive layer. Also, unlike a conventional method of manufacturing that applies a coating composition including conductive fine particles and binder (resin) when forming the transparent conductive layer, it is possible to form the transparent conductive layer by applying a coating composition (dispersion liquid) that does not include resin and then compressing conductive fine particles, and therefore it is possible to reduce the probability of a fall in conductivity due to contact between the conductive fine particles being obstructed by the binder.

It should be noted that the disclosure of the present invention relates to a content of Japanese Patent Application 2005-191886 that was filed on 30 Jun. 2005 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a transparent conductor according to the present invention will now be described with reference to the attached drawings.

First, the construction of a transparent conductive film 1 will be described with reference to the drawings.

Figure 1:
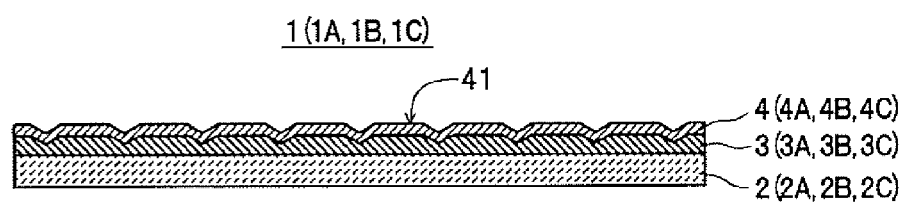
FIG. 1 is a cross-sectional view of a transparent conductive film.

The transparent conductive film 1 shown in FIG. 1 is one example of a transparent conductor according to the present invention and includes a support 2, a resin layer 3, and a transparent conductive layer 4. Note that the term "transparent" for the present invention means that visible light can be transmitted and includes a state where some scattering of light occurs. Here, the extent to which light is scattered differs according to the intended use of the transparent conductive film 1, with a level of scattering normally referred to as "semi-transparent" also included in the term "transparent" for the present invention.

The support 2 is formed in a film-like form or plate-like form using a transparent material such as resin or glass. As examples of the resin material that constitutes the support 2, it is possible to use a polyester resin such as polyethylene terephthalate (PET), a polyolefin resin such as polyethylene or polypropylene, polycarbonate, acrylic, norbornene, and the like. The resin layer 3 is a transparent layer formed on the surface of the support 2 and is formed according to a method described later. The transparent conductive layer 4 is transparent and conductive and is formed (disposed) on the surface of the support 2 via the resin layer 3. The transparent conductive layer 4 is formed according to a method described later, and a surface 41 thereof is formed as a rough surface. Here, the surface 41 of the transparent conductive layer 4 is formed so that a maximum peak height Sp that shows the surface roughness is in a range of 0.35 μm to 0.43 μm, inclusive and a maximum valley depth Sv that also shows the surface roughness is in a range of 1.03 μm to 2.37 μm, inclusive.

Next, the method of manufacturing the transparent conductive film 1 will be described with reference to the drawings.

Figure 2:
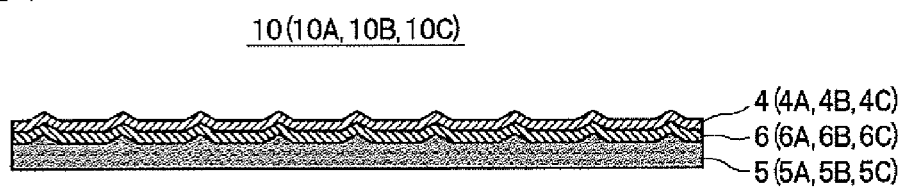
FIG. 2 is a cross-sectional view of a transfer film.

First, as shown in FIG. 2, a transfer film 10 where a base film 5, an anchor layer 6, and the transparent conductive layer 4 are laminated in the mentioned order is fabricated. The transfer film 10 is a film for transferring the transparent conductive layer 4 onto a recipient film 20 (see FIG. 3) described later, and after the transparent conductive layer 4 has been transferred, the base film 5 and the anchor layer 6 are detached from the transparent conductive layer 4. As one example, the base film 5 is composed of resin containing fine inorganic particles such as silicon oxide ($SiO_2$) in a film shape. Fine concaves and convexes that reflect the form of the fine particles are formed in the surface of the base film 5. The anchor layer 6 functions so as to temporarily fix (attach) the transparent conductive layer 4 to the base film 5.

When the transfer film 10 is fabricated, first, a coating composition (for example, a coating composition including silicone resin) for forming the anchor layer 6 is applied onto the base film 5. Here, it is possible to use various well-known application methods as the method of applying the coating composition onto the base film 5. More specifically, when the coating composition has a high viscosity of 1000 cps or higher, for example, it is possible to use a method that uses a blade, knife, or the like. Conversely, when the coating composition has a low viscosity of below 500 cps, a method such as bar coating, kiss coating, squeezing, or a method that uses a mist or spray can be used. In addition, regardless of the viscosity of the coating composition, it is possible to use methods such as reverse rolling, direct rolling, extrusion via a nozzle, curtaining, gravure rolling, and dipping. Next, the coating composition applied onto the base film 5 is dried. By doing so, the anchor layer 6 is formed on the surface of the base film 5.

Next, a dispersion liquid for forming the transparent conductive layer 4 is fabricated. First, by carrying out a well-known dispersion method using a sand grinder mill or a ball mill, conductive fine particles (dispersoid) are dispersed in a dispersion medium to produce the dispersion liquid. As the conductive fine particles, it is possible to use various types of fine particles that can form the transparent conductive layer 4 that is transparent and conductive. As examples, fine particles of tin oxide such as antimony-doped tin oxide (ATO) and fluorine-doped tin oxide (FTO), fine particles of indium oxide such as tin-doped indium oxide (ITO), fine particles of zinc oxide such as aluminum-doped zinc oxide (AZO), and fine particles of cadmium oxide can be used. Here, ITO is preferable since superior conductivity is achieved. As the conductive fine particles, it is also possible to use particles produced by coating the surfaces of transparent fine particles, such as barium sulfate, with ATO, ITO, or the like. The particle diameter of the fine particles can be freely set in accordance with the level of scattering of light required in accordance with the intended use of the transparent conductive film 1, and is typically set in a range of 1.0 µm or below (more preferably, in a range of 0.1 µm or below, and even more preferably in a range of 5 nm to 50 nm, inclusive).

It is also possible to produce the dispersoid by treating the surfaces of the conductive fine particles described above with an inorganic substance. Here, as one example, a silicon compound (such as silicon dioxide $SiO_2$ (including $SiO_{2-X}$ containing a few oxygen defects)) can be used as the inorganic substance used for the surface treatment. Here, by treating the surfaces of the conductive fine particles with an inorganic substance, it is possible to improve the durability of the transparent conductive layer 4 that is formed by compression, and therefore the stability of the electrical resistance over time in a high temperature/high humidity environment is improved.

On the other hand, it is possible to use various well-known liquids as the dispersion medium in which the conductive fine particles are dispersed. More specifically, it is possible to use a saturated hydrocarbon such as hexane, an aromatic hydrocarbon such as toluene and xylene, an alcohol such as methanol, ethanol, propanol, and butanol, a ketone such as acetone, methyl ethyl ketone, methyl isobutyl ketone, and diisobutyl ketone, an ester such as ethyl acetate and butyl acetate, an ether such as tetrahydrofuran, dioxane, and diethyl ether, an amide such as N,N-dimethylformamide, N-methylpyrrolidone (NMP), and N,N-dimethylacetamide, and a halogenated hydrocarbon such as ethylene chloride and chlorobenzene. Out of such dispersion media, polarized dispersion media are preferable, and hydrophilic dispersion media such as alcohols (methanol, ethanol, or the like) or amides (NMP or the like) are more preferable since favorable dispersion can be achieved without mixing in a dispersing agent. Such dispersion media may be used alone, or a mixture of two or more such media may be used. It is also possible to use a dispersing agent in accordance with the type of dispersion media used. Also, although water can be used as the dispersion medium, to make the thickness of the transparent conductive layer 4 uniform, the support 2 needs to be hydrophilic. Accordingly, when a resin film that is normally hydrophobic is used as the support 2, a hydrophilic alcohol should preferably be mixed with the water. Here, the amount of dispersion medium used to disperse the conductive fine particles can be adjusted as appropriate to produce a suitable viscosity for application of the dispersion liquid after dispersion.

Next, the dispersion liquid is applied onto the anchor layer 6. Here, as the method of applying the dispersion liquid, it is possible to use the same types of methods as are used to form the base film 5. Next, by using a drying apparatus, the base film 5 on which the dispersion liquid is applied is dried at a suitable drying temperature for the type of dispersion medium used. By doing so, the dispersion medium in the dispersion liquid evaporates and a conductive fine particle layer is formed by the conductive fine particles (dispersoid) that have been condensed. Next, the conductive fine particle layer is compressed using a sheet press or a roll press. When doing so, the compression force applied to the conductive fine particle layer should preferably be $44N/mm^2$ or higher, more preferably $135N/mm^2$ or higher, and even more preferably $180N/mm^2$.

By doing so, the transparent conductive layer 4 is formed on the anchor layer 6. Here, in this method of manufacturing, since the conductive fine particle layer is compressed, there is an increase in the number of points of contact between the conductive fine particles and the contact area is increased, resulting in an increase in the strength of the transparent conductive layer 4 and an improvement in light transmittance by the transparent conductive layer 4. Also, with this method of manufacturing, it is possible to form the transparent conductive layer 4 without adding a resin that was added as a binder in the conventional method of manufacturing. This means that there is less probability of contact between conductive fine particles being obstructed by the binder, which would result in lower conductivity. Note that additives such as a UV absorber, a surfactant, and a dispersing agent may also be added within a range where no fall in the conductivity of the transparent conductive layer 4 is caused.

Figure 3:
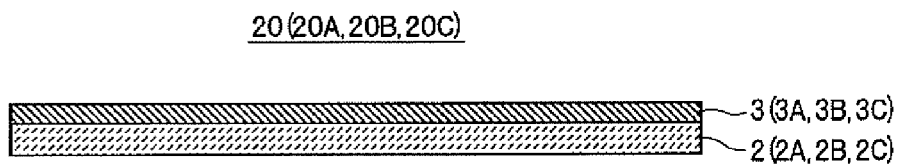
FIG. 3 is a cross-sectional view of a recipient film.

Next, as shown in FIG. 3, a recipient film 20 where the resin layer 3 is laminated on the support 2 is fabricated. More specifically, a coating composition for forming the resin layer 3, which has been produced by dissolving resin in a solvent, is applied onto the support 2. Here, as examples, an organic polymer such as a fluorine polymer, silicone resin, acrylic resin, polyvinyl alcohol, carboxymethyl cellulose, hydroxypropyl cellulose, regenerated cellulose, diacetyl cellulose, polyvinyl chloride, polyvinyl pyrrolidone, polyethylene, polypropylene, SBR, polybutadiene, polyethylene oxide, polyester, and polyurethane, or a precursor (monomer, oligomer) of the same can be used as the resin. Also, as the solvent for dissolving the resin, it is possible to use a saturated hydrocarbon such as hexane, an aromatic hydrocarbon such as toluene and xylene, an alcohol such as methanol, ethanol, propanol, and butanol, a ketone such as acetone, methyl ethyl ketone, methyl isobutyl ketone, and diisobutyl ketone, an ester such as ethyl acetate and butyl acetate, an ether such as tetrahydrofuran, dioxane, and diethyl ether, an amide such as N,N-dimethylformamide, N-methylpyrrolidone (NMP), and N,N-dimethylacetamide, a halogenated hydrocarbon such as ethylene chloride and chlorobenzene, and water. The resin layer 3 functions as an adhesion layer that binds (causes adhesion between) the support 2 and the transparent conductive layer 4. For this reason, an electron beam (UV ray) curable resin is preferably added to the coating composition so that the resin can be hardened by an electron beam such as UV rays. As the method of hardening the resin, it is also possible to use a well-known method such as adding a reactive group to the resin described above. In addition, it is possible to add additives such as a UV absorber, an IR absorber, and a colorant to the coating composition.

On the other hand, as the method of applying the coating composition described above onto the support 2, it is possible to use a well-known method such as reverse rolling, direct rolling, a method that uses a blade or a knife, extrusion via a nozzle, curtaining, gravure rolling, bar coating, dipping, kiss coating, and squeezing. It is also possible to use a method of appling the coating composition onto the support 2 using a mist or a spray. Next, the applied coating composition is dried to vaporize the solvent. By doing so, the resin layer 3 is laminated (formed) on the support 2.

Figure 4:
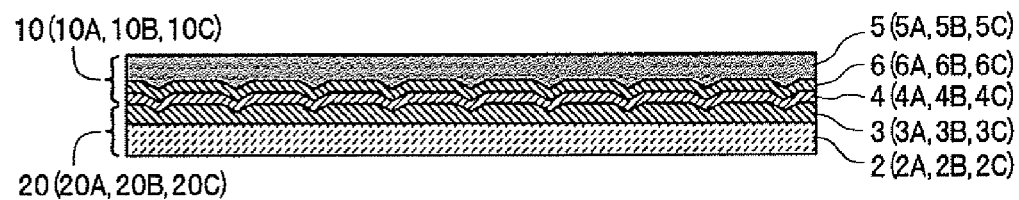
FIG. 4 is a cross-sectional view of a state where the transfer film and the recipient film have been placed in tight contact.
Figures 5, 6:
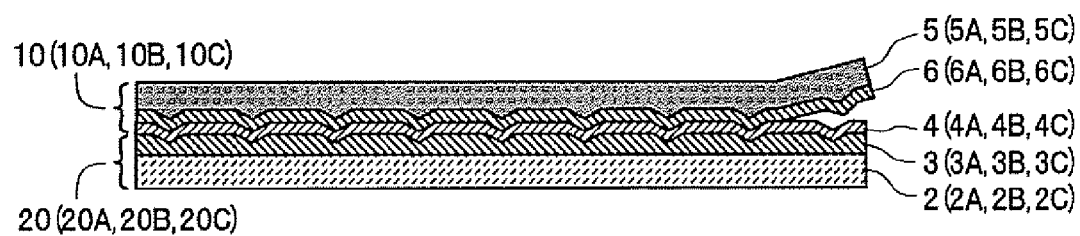
FIG. 5 is a cross-sectional view of a state where a base film and an anchor layer have been detached from a transparent conductive layer.
FIG. 6 is a measurement results table showing measurement results for various transparent conductive films.
Figure 7:
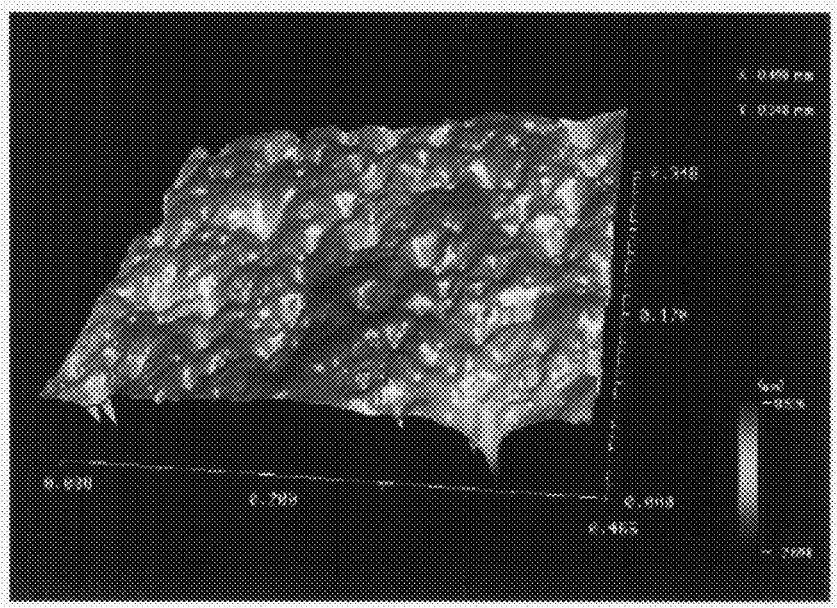
FIG. 7 is a figure-substitute photograph of the surface of a transparent conductive film.
Figure 8:
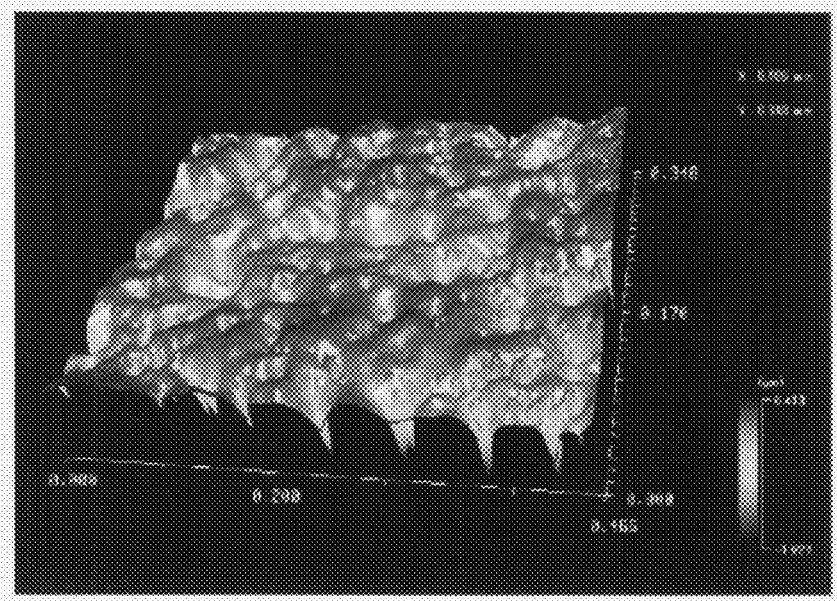
FIG. 8 is a figure-substitute photograph of the surface of another transparent conductive film.
Figure 9:
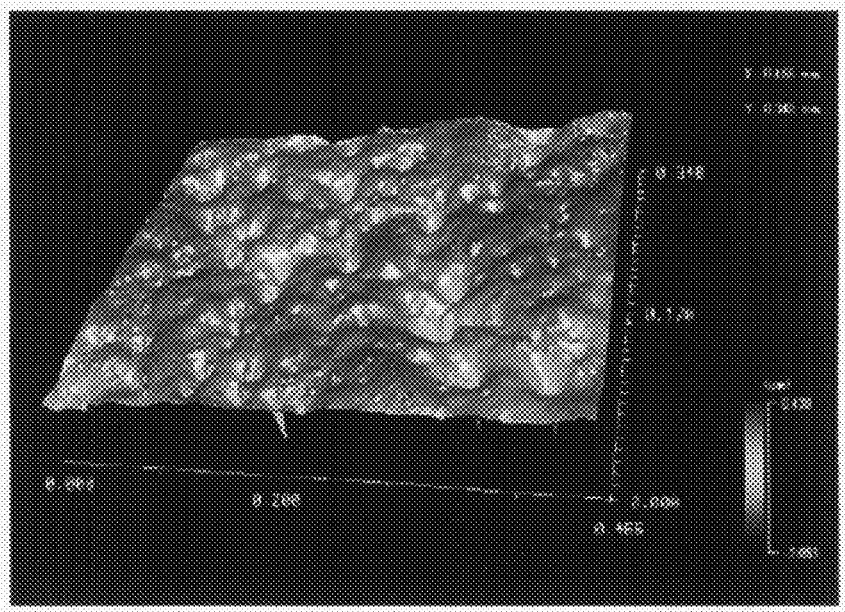
FIG. 9 is a figure-substitute photograph of the surface of yet another transparent conductive film.
Figure 10:
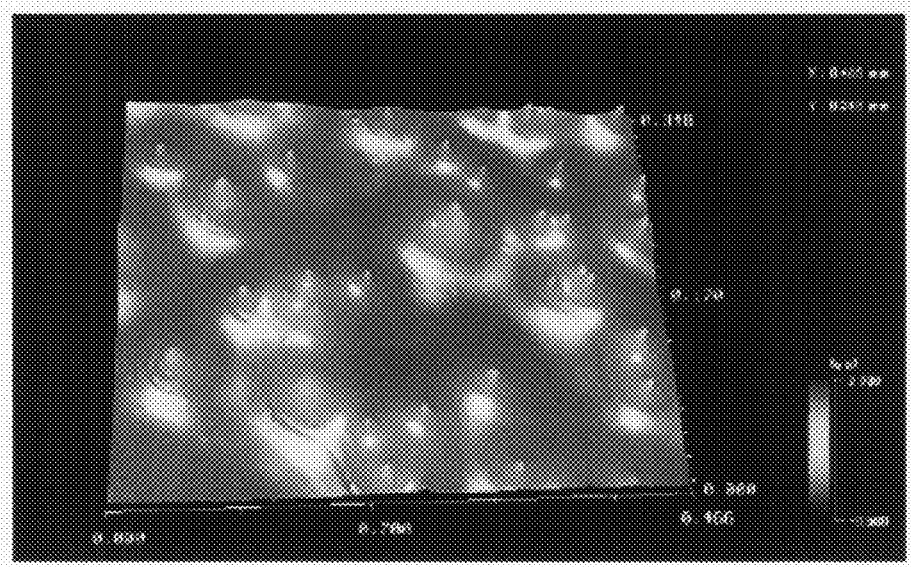
FIG. 10 is a figure-substitute photograph of the surface of yet another transparent conductive film.

Next, as shown in FIG. 4, the transfer film 10 is placed over the recipient film 20 so that the transparent conductive layer 4 of the transfer film 10 and the resin layer 3 of the recipient film 20 are in tight contact. At this time, the resin that forms the resin layer 3 permeates into (and fills) the voids between the conductive fine particles that constitute the transparent conductive layer 4. Next, as one example, when a UV ray curable resin has been added to the coating composition for forming the resin layer 3, UV rays are irradiated from outside (the upper side in FIG. 4) the base film 5 of the transfer film 10 to harden the resin layer 3 and the resin constituting the resin layer 3 that has permeated into the voids in the transparent conductive layer 4. Next, the base film 5 is detached. When doing so, since the contact between the anchor layer 6 and the base film 5 is tighter than the contact between the anchor layer 6 and the transparent conductive layer 4, as shown in FIG. 5, the anchor layer 6 is detached from the transparent conductive layer 4 together with the base film 5. By doing so, as shown in FIG. 1, the transparent conductive layer 4 is transferred via the resin layer 3 onto the support 2 to manufacture the transparent conductive film 1 where the transparent conductive layer 4 is exposed. Here, when the thickness of the transparent conductive layer 4 is below 0.1 μm, there is a risk of an increase in electrical resistance and a fall in the electrical properties of the transparent conductive film 1. On the other hand, if the thickness of the transparent conductive layer 4 exceeds 5 μm, there is a risk of a fall in overall light transmission and a loss in transparency. For this reason, the thickness of the transparent conductive layer 4 should preferably be in a range of 0.1 μm to 5 μm, inclusive.

Next, the characteristics of transparent conductive films 1A to 1C manufactured in the manufacturing procedure described below according to the method of manufacturing described above and the characteristics of a transparent conductive film 1D for comparison purposes manufactured according to a method of manufacturing described later will be described.

The manufacturing procedure of the transparent conductive film 1A will be described first. As shown in FIG. 2, first a transfer film 10A on which the base film 5A, the anchor layer 6A, and the transparent conductive layer 4A have been laminated in the mentioned order was fabricated. In more detail, after a coating composition for forming the anchor layer 6A was applied on the surface of the base film 5A, drying was carried out for 24 hours at 70° C. to harden the coating composition and thereby form the anchor layer 6A with a thickness of 1 μm. Here, PET film ("X42" manufactured by Toray industries Inc.) with a thickness of 26 μm and an arithmetic average height Sa, which shows the surface roughness, of 0.4 μm was used as the base film 5A. Silicone resin (a mixture of 100 parts by weight of liquid A and 300 parts by weight of liquid B of "Frecera N" manufactured by Matsushita Electric Works, Ltd.) was used as the coating composition for forming the anchor layer 6A.

Next, 300 parts by weight of ethanol were added to 100 parts by weight of ITO fine particles ("SUFP-HX" (primary particle diameter: 20 nm) made by Sumitomo Metal Mining Co., Ltd.) and dispersing was carried out using a ball mill to fabricate a coating composition for forming the transparent conductive layer 4A. Here, zirconia beads were used as the dispersion medium. Next, after the coating composition for forming the transparent conductive layer 4A was applied onto the anchor layer 6A using a bar coater, the coating composition was dried by blowing warm air at 50° C., thereby forming an coating film that includes ITO and has a thickness of 1.7 μm (the film in this state is also referred to as the "pre-compression transfer film").

Next, a preliminary test was carried out to confirm the compression pressure. More specifically, a roll press equipped with a pair of metal rolls with a diameter of 140 mm and surfaces that have been hard chrome plated was used, and the pre-compression transfer film was squeezed and compressed at a temperature of 23° C. in a state where the metal rolls were not rotated. When doing so, the pressure per unit length in the widthwise direction of the film was set at 660N/mm. Next, the pressure was released and the length in the lengthwise direction of the compressed part of the pre-compression transfer film was measured. As a result, the length in the lengthwise direction of such part was found to be 1.9 mm. From this result, it was understood that a pressure of 347N/mm² per unit area had been applied. Next, the pre-compression transfer film was compressed between the metal rolls according to the same conditions as the preliminary test described above, the rolls were rotated, and the pre-compression transfer film was compressed at a feed speed of 5 m/min. By doing so, the transfer film 10A was obtained. Here, when measured using an electronic micrometer (K-402B) made by Anritsu Corp., the thickness of the transparent conductive layer 4A was found to be 1.0 μm.

Next, as shown in FIG. 3, a recipient film 20A on which the support 2A and the resin layer 3A have been laminated was fabricated. More specifically, 184 parts by weight of methyl ethyl ketone were added as a solvent to 100 parts by weight of acrylic resin ("1BR-305" (solid content: 39.5%) made by Taisei Kako Co., Ltd.) and 92 parts by weight of WV ray curable resin ("SD-318" made by Dainippon Ink and Chemicals, Inc.) to fabricate the coating composition for forming the resin layer 3A. Next, after the coating composition for forming the resin layer 3A was applied onto a PET film (thickness: 188 μm) as the support 2A, the solvent was vaporized to form the resin layer 3A with a thickness of 8 μm, thereby producing the recipient film 20A. Next, as shown in FIG. 4, the transfer film 10A was placed over the recipient film 20A so that the transparent conductive layer 4A of the transfer film 10A and the resin layer 3A of the recipient film 20A were in tight contact. By doing so, the transparent conductive layer 4A was laminated on the resin layer 3A and the mixture of the acrylic resin and the UV ray curable resin that composes the resin layer 3A (this mixture is hereinafter also referred to as the "UV curable resin etc.") was caused to permeate into the voids in the transparent conductive layer 4A.

Next, UV rays were irradiated from outside the base film 5A of the transfer film 10A to harden the resin layer 3A and the UV curable resin etc. that had permeated into the voids in the transparent conductive layer 4A. Next, as shown in FIG. 5, the base film 5A and the anchor layer 6A were detached from the transparent conductive layer 4A. By doing so, as shown in FIG. 1, the transparent conductive layer 4A was transferred via the resin layer 3A onto the support 2A, thereby producing the transparent conductive film 1A on which the transparent conductive layer 4A was exposed.

Next, the manufacturing procedure of the transparent conductive film 1B will be described. As shown in FIG. 2, first the transfer film 10B on which the base film 5B, the anchor layer 6B, and the transparent conductive layer 4B have been laminated in the mentioned order was fabricated using the same procedure as the transfer film 10A described above. When doing so, the anchor layer 6B was formed with a thickness of 0.5 μm using the same coating composition as the anchor layer 6A described above. Aside from this, the same materials as were used to fabricate the transfer film 10A were used to form the transparent conductive layer 4B with a thickness of 1.0 μm. Next, as shown in FIG. 3, the recipient film 20B on which the support 2B and the resin layer 3B have been laminated was fabricated using the same procedure as when fabricating the recipient film 20A described above. After this, as shown in FIG. 4, the transfer film 10B was placed over the recipient film 20B and UV rays were irradiated from outside the base film 5B of the transfer film 10B to harden the resin layer 3B and the UV curable resin etc. that had permeated into the voids in the transparent conductive layer 4B. Next, as shown in FIG. 5, the base film 5B and the anchor layer 6B were detached to produce the transparent conductive film 1B.

Next, the manufacturing procedure of the transparent conductive film 1C will be described. As shown in FIG. 2, first the transfer film 10C on which the base film 5C, the anchor layer 6C, and the transparent conductive layer 4C have been laminated in the mentioned order was fabricated using the same procedure as the transfer film 10A described above. Here, PET film ("X43" manufactured by Toray industries Inc.) with a thickness of 26 μm and an arithmetic average height Sa, which shows the surface roughness, of 0.35 μm was used as the base film 5C. The anchor layer 6C was formed with a thickness of 0.5 μm using the same coating composition as the anchor layer 6A described above. Aside from this, the same materials as were used to fabricate the transfer film 10A were used to form the transparent conductive layer 4C with a thickness of 1.0 μm. Next, as shown in FIG. 3, the recipient film 20C on which the support 2C and the resin layer 3C have been laminated was fabricated using the same procedure as when fabricating the recipient film 20A described above. After this, as shown in FIG. 4, the transfer film 10C was placed over the recipient film 20C and UV rays were irradiated from outside the base film 5C of the transfer film 10C to harden the resin layer 3C and the UV curable resin etc. that had permeated into the voids in the transparent conductive layer 4C. Next, as shown in FIG. 5, the base film 5C and the anchor layer 6C were detached to produce the transparent conductive film 1C.

Next, the method of manufacturing the transparent conductive film 1D for comparison purposes will be described. First, one surface of a PET film with a thickness of 188 μm and a width of 350 mm was embossed to produce a support 2D. When doing so, the embossing was carried out using a roll with a surface that has been formed by laser engraving so that an arithmetic average height Sa and a maximum cross-sectional height St are 1.9 μm and 35.8 μm, respectively and chrome plated. As the rolling (pressing) conditions, the pressure applied by the press (linear pressure) was set at 35 Kg/cm, the press temperature (the surface temperature of the metal roll) at 175° C. and the press speed at 3 m/min. When the surface roughness of the support 2D subjected to the embossing was measured, the arithmetic average height Sa and the maximum cross-sectional height St were 0.14 μm and 2.78 μm, respectively. Next, the surface of the support 2D that has been embossed was subjected to a corona discharge treatment. After this, a sol-gel solution produced by mixing 6 mol of water, 6 mol of ethyl alcohol and 0.03 mol of hydrochloric acid into 1 mol of tetraethoxysilane was roll-coated onto the surface of the support 2D. Next, hot air was blown onto the surface of the support 2D to cause the solvent to evaporate and then the support 2D was further heated to form a thin film of silica dioxide. After this, ITO was sputtered onto the thin film of silica dioxide to form the transparent conductive layer 4D with a thickness of 25 nm. By doing so, the transparent conductive film 1D where the transparent conductive layer 4D is formed via a thin film of silica dioxide on the support 2D was obtained.

Next, the arithmetic average height Sa and the maximum peak height Sp that show the surface roughness were measured for the transparent conductive layers 4A to 4D of the fabricated transparent conductive films 1A to 1D using a three-dimensional non-contact surface mapping system (Micromap) made by Micromap Corp. of America. The measurement conditions were as follows.

Measurement Mode: Wave Mode
Measurement Area: 640×480 pixels
Magnification: 10 times
Analysis Conditions: Detrending Correction=Plane
  FILL=On
  Median Filter: Xwindow=5, Ywindow=5
  Smooth Filter: Xwindow=5, Ywindow=5

As a result, as shown in FIG. 6, it was found that the arithmetic average heights Sa of the transparent conductive layers 4A to 4D of the fabricated transparent conductive films 1A to 1D were respectively 0.10 μm, 0.12 μm, 0.16 μm, and 0.11 μm. On the other hand, as shown in the same drawing, the maximum peak heights Sp of the transparent conductive layers 4A to 4D were respectively 0.35 μm, 0.43 μm, 0.41 μm, and 1.66 μm.

Next, touch panels 30A to 30D (generically referred to as the "touch panel 30" when no distinction is required) that use the transparent conductive films 1A to 1D were fabricated. Here, transparent conductors where a covering film of ITO (a transparent conductive layer) was formed on a glass substrate and dot-shaped nonconductive spacers were disposed in a matrix on the covering film were used as the respective lower electrodes. The transparent conductive films 1A to 1D were used as the respective upper electrodes. Next, a touch pen made of polyacetal whose tip was spherically (or hemispherically) formed with a diameter of 0.8 mm was used to press (touch) 20 positions on the upper electrodes (the transparent conductive films 1A to 1D) of the touch panels 30A to 30D, respectively and it was visually observed whether Newton's rings (interference fringes) and glare were produced. As a result, as shown in FIG. 6, it was not possible to observe Newton's rings and the like at any of the pressed positions for the touch panels 30A to 30D. From these results, it is clear that when the maximum peak height Sp of the surface 41 of the transparent conductive layer 4 is in a range of 0.35 μm to 1.66 μm, inclusive, light is suitably scattered and the production of Newton's rings and the like is reliably prevented. It is conventionally known that the production of Newton's rings and the like is prevented when the arithmetic average height Sa of the surface 41 of the transparent conductive layer 4 is in a range of 0.05 μm to 0.35 μm, inclusive, and from the results described above, it is clear that the production of Newton's rings and the like is reliably prevented when the arithmetic average height Sa is in a range of 0.10 μm to 0.16 μm, inclusive.

Next, in a state where the pen tip has pressed the surface of the upper electrodes of the respective touch panels 30A to 30D toward the lower electrodes, the pen tip was moved back and forth to cause the upper electrodes and the lower electrodes to slide against each other and the percentage change in resistance of the lower electrode before and after doing so was measured. A 250 g load was added to the touch pen and the pen tip was moved back and forth 150,000 times. As a result, as shown in FIG. 6, with the touch panels 30A to 30C that use the transparent conductive films 1A to 1C, the percentage changes in resistance of the lower electrodes were 1.5%, 2.3%, and 2.5%, respectively, but with the touch panel 30D that uses the transparent conductive film 1D, the percentage change in resistance was as high as 12%. From these measurement results, it is clear that even if the arithmetic average height Sa of the surface 41 of the transparent conductive layer 4 is low as with the transparent conductive film 1D (here, 0.11 μm), when the maximum peak height Sp is high (here, 1.66 μm), when the upper electrode and the lower electrode slide against each other, the pressure is concentrated at the peaks (convex parts) thereof, resulting in damage to the surface 41 of the transparent conductive layer 4 and a large change in resistance. Conversely, if the maximum peak height Sp is in a range of 0.35 µm to 0.43 µm, inclusive, the heights of the peaks are averaged and when the upper electrode and lower electrode slide against each other, the pressure is distributed among the peaks, resulting in less damage to the surface 41 and a smaller change in resistance.

Next, the maximum valley depth Sv and the maximum cross-sectional height St that show the surface roughness of the respective transparent conductive layers 4A to 4D of the transparent conductive films 1A to 1D were measured using the three-dimensional non-contact surface mapping system described above with the same measurement conditions as described above. As a result, as shown in FIG. 6, the absolute values of the maximum valley depths Sv of the respective transparent conductive layers 4A to 4D were respectively 2.37 µm, 2.06 µm, 1.03 µm, and 0.22 µm. On the other hand, as shown in the same drawing, the maximum cross-sectional heights St of the transparent conductive layers 4A to 4D were respectively 2.72 µm, 2.49 µm, 1.44 µm, and 1.88 µm. Next, as shown in FIGS. 7 to 10, the surfaces of the transparent conductive layers 4A to 4D of the transparent conductive films 1A to 4D were mapped using the three-dimensional non-contact surface mapping system described above. From these surface maps, it is clear that when the maximum valley depth Sv is in a range of 1.03 µm to 2.37 µm, inclusive as with the transparent conductive films 1A to 1C, the higher the number of valleys, the lower the number of peaks that protrude from the average surface. On the other hand, it is clear that when the maximum valley depth Sv is low as with the transparent conductive film 1D (here, 0.22 µm), even if the maximum cross-sectional height St is comparatively small (here, 1.88 µm), a large number of peaks protrude from the average surface. Accordingly, from the surface maps and the measurement results described above, it is clear that when the maximum valley depth Sv is small, when the upper electrode and the lower electrode slide against each other, a large number of peaks damage the surface 41 of the transparent conductive layer 4, resulting in a large change in resistance. On the other hand, when the maximum valley depth Sv is in a range of 1.03 µm to 2.37 µm, inclusive, there are few peaks and therefore when the upper electrode and the lower electrode slide against each other, there is less damage to the surface 41 and less change in resistance.

Here, when the maximum peak height Sp of the surface 41 of the transparent conductive layer 4 is in a range of 0.35 µm to 0.43 µm, inclusive and the maximum valley depth Sv is in a range of 1.03 µm to 2.37 µm, inclusive, the height of the peaks is averaged and the number of peaks that protrude from the average surface falls in proportion to the increase in the number of valleys, so that when the upper electrode and lower electrode slide against each other the pressure is distributed among the peaks and the frequency of contact between the peaks and the surface of the lower electrode is reduced. For this reason, it is clear that when the maximum peak height Sp and the maximum valley depth Sv are in the respective ranges described above, damage to the surface 41 is suppressed even more reliably.

In this way, according to the transparent conductive film 1, by forming the transparent conductive layer 4 so that the maximum peak height Sp that shows the surface roughness of the surface 41 is in a range of 0.35 µm to 0.43 µm, inclusive, it is possible to cause light to scatter appropriately, and therefore the production of Newton's rings and the like can be reliably avoided. Also, unlike a transparent conductive film where the maximum peak height Sp is large (the transparent conductive film 1D described above), by setting the maximum peak height Sp in a range of 0.35 µm to 0.43 µm, inclusive, the heights of the peaks can be averaged, so that when the upper electrode and the lower electrode slide against each other, the pressure is distributed among the peaks and it is therefore possible to reliably reduce damage to the surface 41. Accordingly, with a touch panel in which the transparent conductive film 1 is incorporated, it is possible to reliably prevent the production of Newton's rings and to sufficiently improve durability.

Also, according to the transparent conductive film 1, by forming the transparent conductive layer 4 so that the maximum valley depth Sv that shows the surface roughness of the surface 41 is in a range of 1.03 µm to 2.37 µm, inclusive, it is possible to cause light to scatter appropriately, and therefore the production of Newton's rings and the like can be reliably prevented. Also, unlike a transparent conductive film where the maximum valley depth Sv is small (the transparent conductive film 1D described above), by setting the maximum valley depth Sv in a range of 1.03 µm to 2.37 µm, inclusive, it is possible to reduce the number of peaks proportionate to the increase in the number of valleys, so that when the upper electrode and the lower electrode slide against each other, it is possible to reliably reduce damage to the surface 41. Accordingly, with a touch panel in which the transparent conductive film 1 is incorporated, it is possible to reliably prevent the production of Newton's rings and to sufficiently improve durability.

According to the transparent conductive film 1, by forming the transparent conductive layer 4 so that the maximum peak height Sp that shows the surface roughness of the surface 41 is in a range of 0.35 µm to 0.43 µm, inclusive, and the maximum valley depth Sv that also shows the surface roughness of the surface 41 is in a range of 1.03 µm to 2.37 µm, inclusive, it is possible to average the heights of the peaks and to reduce the number of peaks proportionate to the increase in the number of valleys, it is possible to distribute the pressure among the peaks when the upper electrode and the lower electrode slide against each other and to lower the frequency of contact between the peaks and the surface of the lower electrode. As a result, it is possible to reduce damage to the surface 41 more reliably. Accordingly, with a touch panel in which the transparent conductive film 1 is incorporated, it is possible to reliably reduce the production of Newton's rings and the like and to significantly improve durability.

Also, with the transparent conductive film 1, by constructing the transparent conductive layer 4 by compressing conductive fine particles, it is possible to increase the points of contact between the conductive fine particles and to increase the contact area, thereby increasing the strength of the transparent conductive layer 4 and improving the light transmittance of the transparent conductive layer 4. Also, by compressing the conductive fine particles, unlike the conventional method of manufacturing, it is possible to form the transparent conductive layer 4 without adding resin as a binder, and therefore it is possible to reduce the probability of a fall in conductivity due to contact between the conductive fine particles being obstructed by the binder.

Note that the present invention is not limited to the construction described above. For example, although an example where the transparent conductive film 1 as a transparent conductor according to the present invention is used as the upper electrode of the touch panel 30 has been described, it should be obvious that the present invention can be used as the lower electrode of the touch panel 30. In addition, although an example where the transparent conductive layer 4 is disposed (formed) on the support 2 via the resin layer 3, the present invention can be applied to a transparent conductive film where the transparent conductive layer 4 is disposed (formed) directly on the support 2. Also, although an example where the transparent conductive layer 4 is formed by compressing a layer of conductive fine particles has been described, the compressing process can be omitted as appropriate in accordance with the type and size of the conductive fine particles.

What is claimed is:

1. A transparent conductor, comprising:
a film-shaped or plate-shaped support; and
a transparent conductive layer that is disposed on the support and has a surface formed as a rough surface,
wherein the surface of the transparent conductive layer is formed so that a maximum peak height that shows a surface roughness of the surface is in a range of 0.35 μm to 0.43 μm, inclusive.

2. A transparent conductor according to claim 1, wherein the transparent conductive layer is constructed by compressing conductive fine particles.

3. A transparent conductor, comprising:
a film-shaped or plate-shaped support; and
a transparent conductive layer that is disposed on the support and has a surface formed as a rough surface,
wherein the surface of the transparent conductive layer is formed so that a maximum valley depth that shows a surface roughness of the surface is in a range of 1.03 μm to 2.37 μm, inclusive.

4. A transparent conductor according to claim 3, wherein the transparent conductive layer is constructed by compressing conductive fine particles.

5. A transparent conductor, comprising:
a film-shaped or plate-shaped support; and
a transparent conductive layer that is disposed on the support and has a surface formed as a rough surface,
wherein the surface of the transparent conductive layer is formed so that a maximum peak height that shows a surface roughness of the surface is in a range of 0.35 μm to 0.43 μm, inclusive and a maximum valley depth that shows the surface roughness of the surface is in a range of 1.03 μm to 2.37 μm, inclusive.

6. A transparent conductor according to claim 5, wherein the transparent conductive layer is constructed by compressing conductive fine particles.

\* \* \* \* \*